United States Patent [19]

Ohnaka et al.

[11] Patent Number: 4,956,682
[45] Date of Patent: Sep. 11, 1990

[54] OPTOELECTRONIC INTEGRATED CIRCUIT

[75] Inventors: Kiyoshi Ohnaka, Moriguchi; Hiraaki Tsujii, Nara; Yoichi Sasai, Hirakata; Jun Shibata, Kawachinagano, all of Japan

[73] Assignee: Matsushita Electric Industrial Co., Ltd., Osaka, Japan

[21] Appl. No.: 154,214

[22] Filed: Feb. 10, 1988

[30] Foreign Application Priority Data

Apr. 28, 1987 [JP] Japan .................................. 62-105140
May 29, 1987 [JP] Japan .................................. 62-135079

[51] Int. Cl.$^5$ ............................................. H01L 27/02
[52] U.S. Cl. ........................................ 357/16; 357/40; 357/17; 357/34; 372/50
[58] Field of Search ................. 357/16, 40, 34, 17, 357/19, 43; 372/50

[56] References Cited

U.S. PATENT DOCUMENTS

| | | | |
|---|---|---|---|
| 4,438,446 | 3/1984 | Tsang | 357/16 |
| 4,647,953 | 3/1987 | Okajima et al. | 357/17 |
| 4,786,951 | 11/1988 | Tokuda et al. | 357/16 |
| 4,801,993 | 1/1989 | Ankri et al. | 357/16 |
| 4,835,579 | 5/1989 | Ishibashi et al. | 357/16 |

OTHER PUBLICATIONS

Katz et al., "A Monolithic Integration of GaAs/-GaAlAs Bipolar transistor and Heterostructure Laser", Jul. 15, 1980, Applied Physics Letters, 37, pp. 211-213.
"Monolithic Integration of LD/HBTs on a Semi-Insulating InP Substrate", Ohnaka et al.; Transactions on the Institute of Electronics, Information and Communication Engineers, vol. J71-C, No. 5, pp. 748-754.
Applied Physics Letters, pp. 191-193, vol. 45 (published 1984).

Primary Examiner—Andrew J. James
Assistant Examiner—Courtney A. Bowers
Attorney, Agent, or Firm—Wenderoth, Lind & Ponack

[57] ABSTRACT

An optoelectronic integrated circuit includes an N+ type cladding layer, an N type cladding layer, an active layer smaller in band gap than the N type cladding layer and a P type waveguide greater in band gap than the active layer sequentially formed on a semi-insulating substrate, a P type cladding layer partially formed on the surface of the P type waveguide, a laser composed of these N+ type and N type cladding layers, active layer, waveguide and P type cladding layer, and an N type emitted layer wider in band gap than the P type waveguide formed partially on the surface of the P type waveguide, thereby composing a heterojunction bipolar transistor using the N type cladding layer as the collector and the P type waveguide as the base.

1 Claim, 7 Drawing Sheets

OPTOELECTRONIC INTEGRATED CIRCUIT

BACKGROUND OF THE INVENTION

This invention relates to an optoelectronic integrated circuit (OEIC) having a semiconductor laser, light emitting diodes and other light emitting devices, and heterojunction bipolar transistors (HBTs) and other electronic devices for driving these light emitting devices integrated on a same substrate.

The optoelectronic integrated circuit having a semiconductor laser, light emitting diodes and other light emitting devices, and heterojunction bipolar transistors and other electronic devices for driving these light emitting devices integrated on a same substrate is expected to be high in performance, high in reliability and low in price as the light source to be used in long distance optical fiber communication using local area network (LAN) and silica glass fiber, and high speed data communication by optical fibers between computers. Various methods have been proposed for the OEIC. For example, as disclosed in Applied Physics Letters, pp. 191-193, vol. 45 (published 1984), a conventional device integrating a buried heterostructure (BH) laser and a heterojunction bipolar transistor is known. The method of fabrication and structure of this prior art are described below. As shown in FIG. 4A, in order to form a double heterojunction (DH) on an N type InP substrate 301, an N type InP cladding layer 302 (carrier density $5 \times 10^{17}$ cm$^{-3}$, thickness 5 μm), an InGaAsP active layer 303 (band gap wavelength λg=1.3 μm, thickness 0.15 μm), and a P type InP cladding layer 304 (carrier density $5 \times 10^{17}$ cm$^{-3}$, thickness 2.5 μm), and a P type InGaAsP contact layer 305 (band gap wavelength λg=1.3 μ, thickness 0.5 μm) are sequentially formed by liquid phase epitaxy (LPE) technique. A silicon dioxide film (SiO$_2$ film) 306 formed in a thickness of 50 nm by a thermal chemical vapor deposition (CVD) method is formed in stripe in a width of, for example, 7 μm, and using this silicon dioxide film 306 as the mask, a dove-tail shaped mesa 307 is formed as shown in FIG. 4B with the bromine diluted to 2 wt. % by methanol. Afterwards, by the liquid phase epitaxial method, the dove-tail shaped mesa 307 is sequentially (buried up) with a P type InP separation layer 311 (carrier density $1 \times 10^{17}$ cm$^{-3}$, thickness 1 μm), an N type InP collector layer 312 (carrier density $1 \times 10^{17}$ cm$^{-3}$, thickness 2 μm), a P type InGaAsP base layer 313 (band gap wavelength λg=1.1 μm, carrier density $1 \times 10^{17}$ cm$^{-3}$, thickness 0.3 μm), and an N type InP emitter layer 314 (carrier density $5 \times 10^{17}$ cm$^{-3}$, thickness 0.7 μm), an N type InGaAsP emitter contact layer 315 (band gap wavelength λg=1.3 μm, carrier density $1 \times 10^{17}$ cm$^{-3}$, thickness 0.5 μm) (FIG. 4C).

In the next step, a 200 nm thick silicon nitride film (Si$_3$N$_4$ film) is deposited by plasma-assisted CVD method on the surface of laser part 316 and emitter contact layer 315 in the heterojunction bipolar transistor part 317, and using it as the mask, the emitter contact layer 315 is selectively etched by a mixed solution of H$_2$SO$_4$:H$_2$O$_2$:H$_2$O=1:1:5. Next, using a newly deposited 300 nm thick silicon nitride film 318 as the mask, the emitter layer 314 and base layer 313 are selectively etched by a mixed solution of HCl:H$_3$PO$_4$=1:2 and a mixed solution of H$_2$SO$_4$:H$_2$O$_2$:H$_2$O=1:1:5 respectively, and a mesa of the laser part 316 and the transistor part 317 is formed, so that the shape as shown in FIG. 4D is obtained.

Furthermore, using the newly deposited 300 nm thick silicon nitride film 319 and 200 nm thick silicon dioxide film 320 as the mask by opening holes in these two films, a P type impurity Zn is diffused for 1 hour at 500° C. until reaching a P type InP separation layer 311 in a fused silica ampule using ZnP$_2$ as diffusion source, and a isolation region 321 for electric isolation between heterojunction bipolar transistors is formed. Further opening holes in the graft base of the two films 319, 320, a P type impurity Zn is diffused for 10 minutes at 500° C. until reaching or passing through the base layer 313 in a fused silica ampule using ZnP$_2$ as diffusion source, thereby forming a graft base region 322 as shown in FIG. 4E.

After completely removing the two films 319, 320, a 400 nm thick silicon dioxide film 323 is deposited, and 10/15/300 nm thick Au/Sn/Au is evaporated, and an emitter electrode 324 and a collector electrode 325 are formed by the lift-off method. Furthermore, evaporating 10/10/300 nm thick Au/Zn/Au, an anode electrode 326, a base electrode 327, and a electrode 328 of isolation region are formed by the lift-off method as shown in FIG. 4F.

Then, in order to electrically separate the laser part 316 and heterojunction bipolar transistor part 317, an opening is made in the silicon dioxide film 323, and the collector layer 312 and separation layer 311 are etched by using a mixed solution of HCl:H$_3$PO$_4$=1:2, and a separation groove is formed, and an polyimide film 329 is buried in the separation groove as shown in FIG. 4G.

Evaporating 100/1000 nm thick Ti/Au, an interconnection 330 between devices is formed by the lift-off method. When the back side of the N type InP substrate 301 is polished to a thickness of 100 μm and a cathode electrode 331 is formed by evaporating 10/15/300 nm thick Au/Sn/Au, an optoelectronic integrated circuit having BH laser and heterojunction bipolar teansistor integrated together is obtained as shown in FIG. 4H.

FIG. 5 shows the equivalent circuit of the conventional optoelectronic integrated circuit of FIG. 4. In this optoelectronic integrated circuit, three heterojunction bipolar transistors are integrated, and they compose a differential switch for driving the BH laser, and since the heterojunction bipolar transistors are provided adjacent to the BH laser, the wiring parasitic capacity between devices is small, and high speed operation is possible. In addition, since the heterojunction bipolar transistors are formed in the buried layer, the epitaxial growth is required only twice, and the fabrication is easy.

In said conventional optoelectronic integrated circuit, when an attempt is made to raise the operating speed over 1 GHz, since the P type InP buried layer is forming a PN junction nearly over the entire surface of the (heterojunction bipolar transistor) collector layer and an N type InP cladding layer of the BH laser, the junction capacity is large, and when an attempt is made to lower the resistance of the collector layer, the carrier density of the collector layer cannot be raised over $2 \times 10^{17}$ cm$^{-8}$ in order to set the breakdown voltage over 10 V due to the relationship of the breakdown voltage between the collector layer and separation layer, and the collector resistance is high, and since the carrier density of collector layer is $1 \times 10^{17}$ cm$^{-3}$, the contact resistance of the collector is as high as 30 Ω, which was an obstacle to increasing the operation speed.

In the prior art, moverover, each layer of a heterojunction bipolar transistor is formed by a second liquid phase epitaxial growth, but since the reverse mesa shape has been already formed at this time, and the surface is not flat, the film thickness of each layer is uneven within the plane. Therefore, the thickness of base layer differs with the heterojunction bipolar transistor device, and the current gain varies with the device. The nonuniformity particularly matters for more sophisticated optoelectronic integrated circuits.

Still more, when an attempt is made to raise the speed of heterojunction bipolar transistor, it is necessary to raise the carrier density of the base, lower the base resistance, lower the carrier density of the collector contacting the base, and reduce the collector capacity, but when an attempt is made to raise the carrier density of the base, the base impurity (for example, Zn) diffuses again into the collector side at the time of the second liquid phase epitaxial growth, and a band gap to block the diffusion of the few carriers not present in the base is formed in a wide layer to lower the current gain.

In the prior art, yet, thermal diffusion is conducted for a long period of time in order to separate the devices electrically, and by this heat treatment, thermal damage was induced to lower the yield of the circuit.

SUMMARY OF THE INVENTION

It is hence a primary object of this invention to solve the above-discussed problems in the direction of a higher speed and higher degree of integration than in the conventional optoelectronic integrated circuit.

This and other objects of the invention are accomplished by an optoelectronic integrated circuit comprising a first cladding layer of a first type of conductivity formed on a semi-insulating substrate, an active layer formed on said first cladding layer of said first type of conductivity being smaller in band gap than said first cladding layer, an waveguide layer of a second type of conductivity formed on said active layer being wider in band gap than said active layer, and a second cladding layer of said second type of conductivity formed partially on the surface of said waveguide layer of said second type of conductivity, wherein a laser is composed of said first cladding layer, active layer, waveguide layer, and second cladding layer, and there is also an emitter layer of said first type of conductivity formed partially on the surface of said optical waveguide layer of said second type of conductivity being wider in band gap than said waveguide layer, thereby composing a heterojunction bipolar transistor whose collector is said cladding layer of said first type of conductivity and whose base is said waveguide layer of said second type of conductivity.

According to the present invention as described herein, the following benefits, among others, are obtained:

By the above constitution, the optoelectronic integrated circuit of this invention has a simple structure in which the N-type cladding layer of the laser and the collector layer of the heterojunction bipolar transistor, and the P-type optical waveguide layer of the laser and the base layer of the heterojunction bipolar transistor are respectively common to each other, and since the formation of the base layer is liquid phase epitaxial growth on the surface of a flat substrate, the thickness is uniform, and, at the same time, the nonuniformity of the current gain between devices is reduced.

Furthermore, according to this constitution, since the P type separation layer is not needed, the stray capacitance is small, and the carrier density of the collector layer contacting the base can be lowered, so that the collector capacity can be reduced, and hence the carrier density of the collector contacting the semi-insulating substrate can be raised, and the collector resistance can be reduced, which makes it possible to raise the speed of operation.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
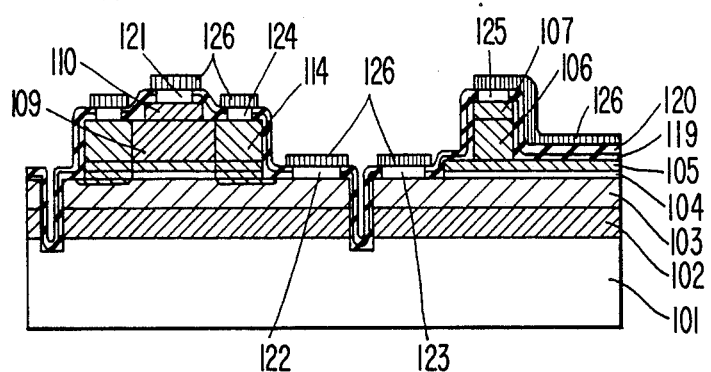
FIG. 1 is a sectional view of an optoelectronic integrated circuit in accordance with a first embodiment of this invention.
Figure 5:
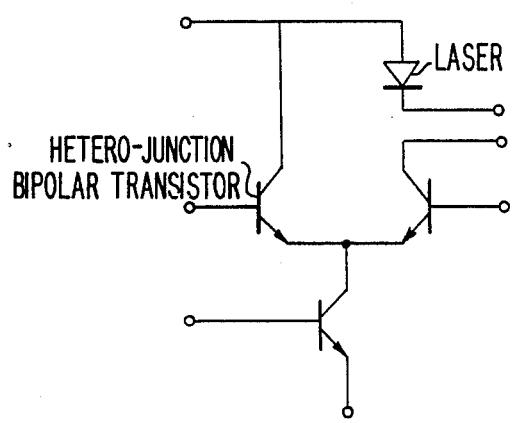
FIG. 5 is a equivalent circuit diagram of the conventional optoelectronic integrated circuit.

Hereinbelow is described the application of this invention in InP/InGaAsP optoelectronic integrated circuits according to some of the embodiments. FIG. 1 is a sectional view of an optoelectronic integrated circuit in accordance with a first embodiment, and FIG. 2A to FIG. 2H are sectional views showing the fabrication steps of the optoelectronic integrated circuit in accordance with the first embodiment of this invention.

Figure 2A:
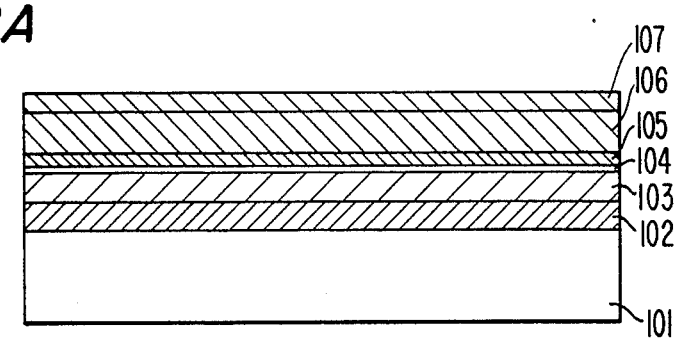
FIG. 2A to FIG. 2H are sectional views showing the fabrication steps of the optoelectronic integrated circuit in accordance with the first embodiment.

As shown in FIG. 2A, on a semi-insulating InP substrate 101 whose principal plane is (100) plane are formed an N+ type higher carrier density InP cladding layer 102 (for example, carrier density $1 \times 10^{18}$ cm$^{-3}$, thickness 1 $\mu$m), an N type lower carrier density InP cladding layer 103 (for example, carrier denstiy $1 \times 10^{17}$ cm$^{-3}$, thickness 1 $\mu$m), an InGaAsP active layer 104 whose band gap is narrow than that of said N type InP cladding layer 103 (for example, band gap wavelength $\lambda g = 1.3$ $\mu$m, thickness 0.15 $\mu$m), a P type InGaAsP waveguide layer 105 whose band gap is wider than that of said active layer 104 (for example, band gap wavelength $\lambda g = 1.1$ $\mu$m, carrier density $5 \times 10^{17}$ cm$^{-3}$, thickness 0.3 $\mu$m), a P type InP cladding layer 106 (for example, carrier density $5 \times 10^{17}$ cm$^{-3}$, thickness 1 $\mu$m), and a P type InGaAsP contact layer 107 (for example, band gap wavelength $\lambda g = 1.3$ $\mu$m, carrier density $1 \times 10^{18}$ cm$^{-3}$, thickness 0.5 $\mu$m), sequentially by liquid phase epitaxial growth.

Figure 2B:
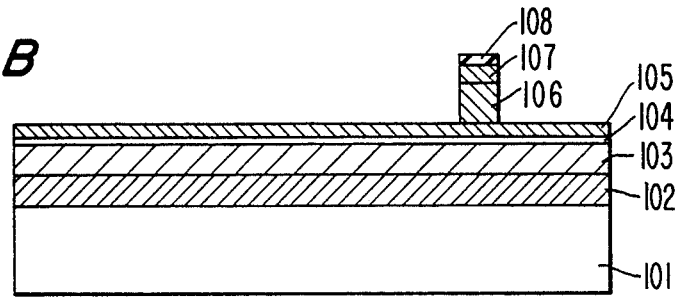

In the next step, a 300 nm thick silicon nitride film 108 formed, for example, by a plasma-assisted CVD method is formed parallel to the direction of (011) in a stripe of width of, for example, 5 $\mu$m, and using this silicon nitride film 108 as mask, the P type InGaAsP contact layer 107 is etched by using a mixed solution of $H_2SO_4$:$H_2O_2$:$H_2O = 1:1:5$, and the P type InP cladding layer 106 is etched by a mixed solution of $HCl$:$H_3PO_4 = 1:2$, so that a ridge is formed as shown in FIG. 2B.

Figure 2C:
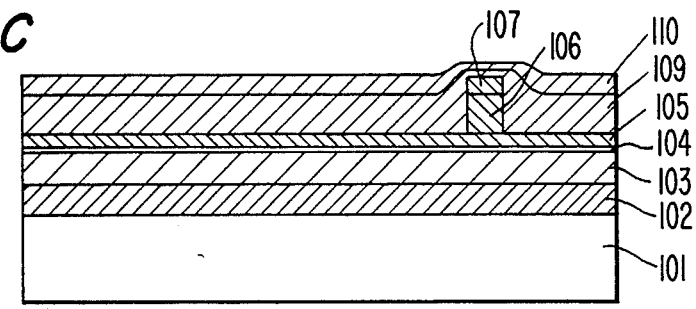

After removing the silicon nitride film 108 by, for example, a mixed solution of $HF$:$NH_4F = 1:10$, the ridge is covered with an N type InP emitter layer 109 (for example, carrier density $5 \times 10^{17}$ cm$^{-3}$, thickness 1 $\mu$m) and an N type InGaAs emitter contact layer 110 (for example, carrier density $1 \times 10^{18}$ cm$^{-3}$, thickness 0.5 $\mu$m) sequentially grown by the liquid phase epitaxy, the result becomes as shown in FIG. 2C.

Figure 2D:
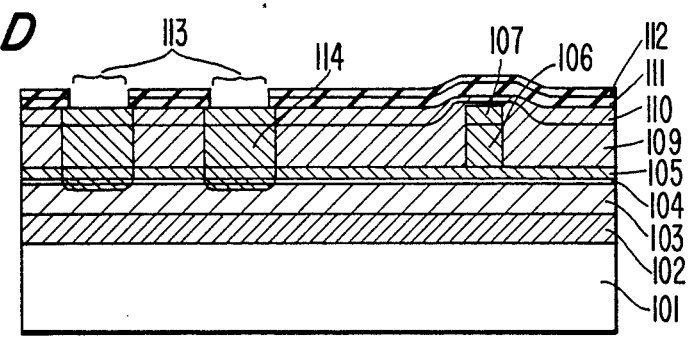

Then, an opening 113 is made in a twin layer film composed of a 300 nm thick silicon nitride film 111 deposited, for example, by a plasma assisted CVD method and 200 nm thick silicon dioxide film 112 deposited, for example, by a thermal CVD method, and using this twin layer film as the mask, Zn which is a P type impurity is diffused from the opening 113 for 10 minutes at 500° C. until reaching or passing through the base layer (waveguide layer) 105 in a fused silica ampule, using $ZnP_2$ as diffusion source, and a graft base region 114 is formed as shown in FIG. 2D. Furthermore, using the silicon nitride film 111 as the mask, the N type InGaAs emitter contact layer 110 is etched by a mixed solution of, for example, $H_2SO_4$:$H_2O_2$:$H_2O_2 = 1:1:5$, and furthermore by providing side etching, the InGaAs emitter contact layer 110 in the Zn diffusion region is removed.

Figure 2E:
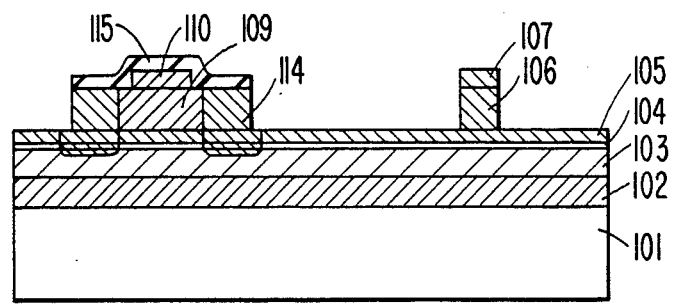

Sequentially, a 300 nm silicon nitride film 115 newly deposited, for example, by a plasma assisted CVD method is partially formed, and using this silicon nitride film 115 as the mask, the N type InGaAs emitter contact layer 110 is etched by a mixed solution of, for example $H_2SO_4$:$H_2O_2$:$H_2O = 1:1:5$, and also the N type InP emitter layer 109 is etched by a mixed solution of, for example, $HCl$:$H_3PO_4 = 1:2$, so that the shape as shown in FIG. 2E is obtained. At the time of this etching, the P type InGaAsP contact layer 107 of the ridge part is not etched and is left over because the etching speed to the mixed solution of $H_2SO_4$:$H_2O_2$:$H_2O = 1:1:5$ is slower than that of the N type InGaAs emitter contact layer 110 (about 1/10), so that the ridge part is built up in the shape of FIG. 2B.

Figure 2F:
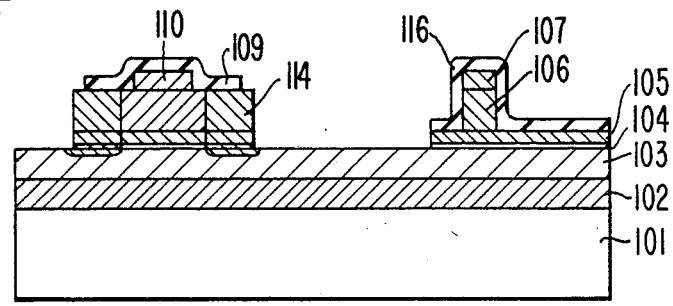

Then, forming a 300 nm thick silicon nitride film 116 newly deposited by, for example, a plasma-assisted CVD method partly in a manner to cover the heterojunction bipolar transistor part and laser part, the P type InGaAsP base layer (waveguide layer) 105 and InGaAsP active layer 104 are etched by a mixed solution of, for example, $H_2SO_4$:$H_2O_2$:$H_2O = 1:1:5$, so that the surface of the N type InP collector layer (cladding layer) 103 is exposed as shown in FIG. 2F.

Figure 2G:
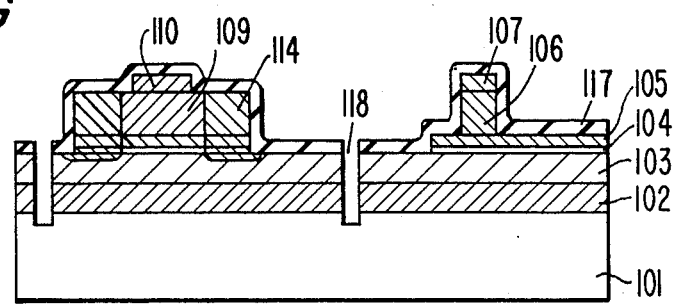

After that, an opening is made in a 300 nm silicon nitride film 117 newly deposited by, for example, a plasma-assisted CVD method, and using this silicon nitride film 117 as the mask, the N type InP collector layer (cladding layer) 103 and N+ type InP cladding layer 102 are etched by using a mixed solution of, for example, $HCl$:$H_3PO_4 = 1:2$, and, as a result, a separation layer 118 for electrically isolating and separating the devices is formed as shown in FIG. 2G. The separation groove 118 has a side surface perpendicular to the principal plane of the semi-insulating InP substrate as shown in FIG. 2G in the direction of $<011>$ parallel to the stripe of the laser, while it has a tapered side surface in V-form in the direction $<01\bar{1}>$ perpendicular to the laser stripe.

Figure 2H:
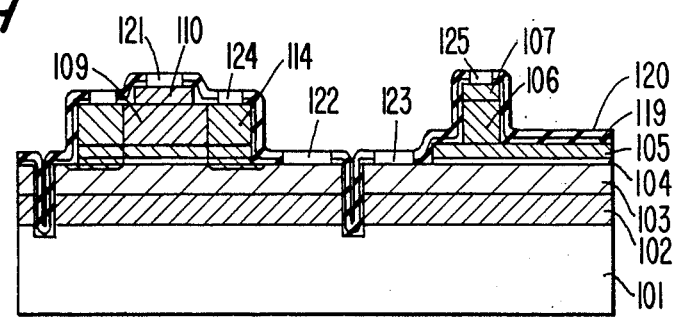

Having done this, a 300 nm thick silicon nitride film 119 deposited, for example, by a plasma-assisted CVD method and a 200 nm thick silicon dioxide film 120 deposited, for example, by a thermal CVD method are formed as passivation films, and then, as a contact metal, for example, 10/15/300 nm thick Au/Sn/Au is evaporated, and an emitter electrode 121, a collector electrode 122, and a cathode electrode 123 are formed by a lift-off method. Furthermore, for example, evaporating 10/10/300 nm thick Au/Zn/Au electrode, a base electrode material 124 and an anode electrode 125 are formed by a lift-off method, which results as shown in FIG. 2H.

Finally, for example, evaporating 50/50/400 nm thick Cr/Pt/Au electrode material, an interconnection 126 of devices is formed by the lift-off method, so that an optoelectronic integrated circuit in an embodiment of this invention is completed as shown in FIG. 1. In this interconnection, disconnection may be prevented by running the interconnection crossing the separation groove 118 along the tapered side surface in V-form of the separation groove in the direction of $<01\bar{1}>$.

One of the features of the first embodiment of this invention described above is a simple structure in which the N type cladding layer of the laser and collector layer of heterojunction bipolar transistor, and the P type optical waveguide layer of the laser and base layer of heterojunction bipolar transistor are common to each other, respectively, and another feature is that the current gain is uniform among the devices because the base layer is formed on a flat substrate surface by a first epitaxial growth and the thickness is uniform.

Other features of the first embodiment of this invention above include, among others, the simple structure of the device because the conventionally required P type InP separation layer is not needed, lowering of carrier density of the N type InP collector layer (cladding layer) contacting the base by the two-layer structure of the collector layer, and also increasing in carrier density of the N+ type InP collector layer (cladding layer) contacting the semi-insulating substrate. Accordingly, it is possible to reduce the collector capacity and decrease the collector resistance.

FIG. 3A to FIG. 3H are crosssectional views showing the manufacturing steps of an optoelectronic integrated circuit in accordance with a second embodiment of this invention.

Figure 3A:
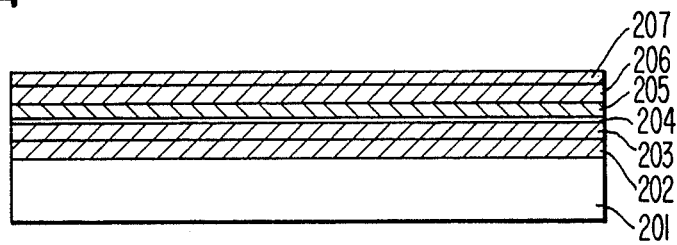
FIG. 3A to FIG. 3H are sectional views showing the fabrication steps of an optoelectronic integrated circuit in accordance with a second embodiment of this invention.

As shown in FIG. 3A, on a semi-insulating InP substrate 201 whose principal plane is (100) plane are formed an N+ type high carrier density InP cladding layer 202 (for example, carrier density $1 \times 10^{18}$ cm$^{-3}$, thickness 1 $\mu$m), an N type low carrier density InP cladding layer 203 (for example, carrier density $1 \times 10^{17}$ cm$^{-3}$, thickness 1 $\mu$m), an InGaAsP active layer 204 narrower in band gap than said N type InP cladding layer 203 (for example, band gap wavelength $\lambda g = 1.3$ $\mu$m, thickness 0.15 $\mu$m), a P type InGaAsP optical waveguide layer 205 wider in band gap than said active layer 204 (for example, band gap wavelength $\lambda g = 1.1$ $\mu$m, carrier density $5 \times 10^{17}$ cm$^{-3}$, thickness 0.3 $\mu$m), an N type InP emitter layer 206 (for example, carrier density $5 \times 10^{17}$ cm$^{-3}$, thickness 1 $\mu$m), and an N type InGaAsP emitter contact layer 207 (for example, band gap wavelength $\lambda g = 1.3$ $\mu$m, carrier density $1 \times 10^{18}$ cm$^{-3}$, thickness 0.5 $\mu$m), sequentially grown by liquid phase epitaxy.

Figure 3B:
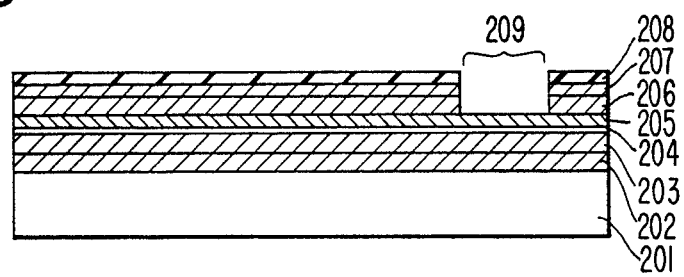

Next, in a 300 nm thick silicon nitride film 208 deposited, for example, by a plasma-assisted CVD method, an opening is made parallel to the direction of (011) in a stripe with a thickness of, for example, 15 μm, and using this silicon nitride film 208 as a mask, the N type InGaAsP emitter contact layer 207 is etched by a solution $H_2SO_4:H_2O_2:H_2O = 1:1:5$, and the N type InP emitter layer 206 is etched by a mixed solution of $HCl:H_3PO_4 = 1:2$, so that a groove 209 is formed as shown in FIG. 3B.

Figure 3C:
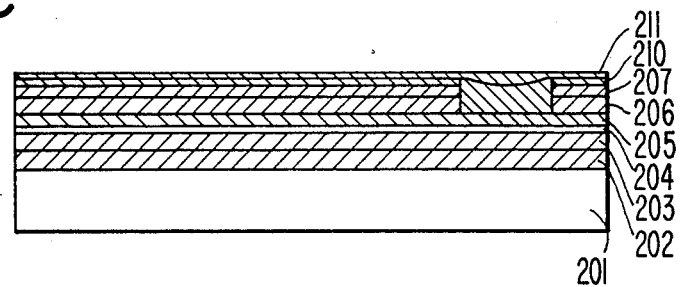

After removing the silicon nitride film 208 by, for example, a mixed solution of $HF:NH_4F = 1:10$, the groove is buried sequentially with a P type InP cladding layer 210 (for example, carrier density $5 \times 10^{17}$ cm$^{-3}$, thickness at groove part 1 μm) and P type InGaAs contact layer 211 (for example, carrier density $1 \times 10^{18}$ cm$^{-3}$, thickness at groove part 0.5 μm) by liquid phase epitaxy, and the result becomes as shown in FIG. 3C.

Figure 3D:
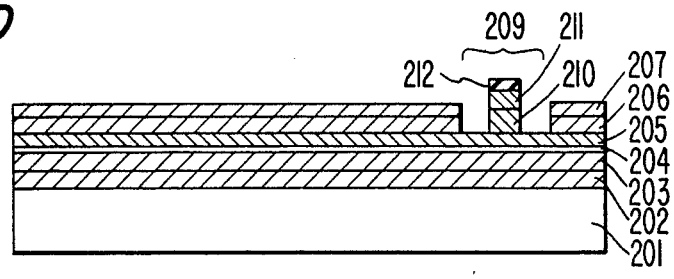

Then, a 300 nm thick silicon nitride film 212 deposited, for example, by a plasma-assisted CVD method is formed on the groove 209 parallel to the direction of 011 in a stripe form with width of, for example, 5 μm, and by using this silicon nitride film 212 as the mask, the P type InGaAs contact layer 210 is etched by a mixed solution of, for example, $H_2SO_4:H_2O_2:H_2O = 1:1:5$, and furthermore the P type InP cladding layer 209 is etched by a mixed solution of, for example, $HCl:H_2PO_4 = 1:4$, so that the shape becomes as shown in FIG. 3D.

Figure 3E:
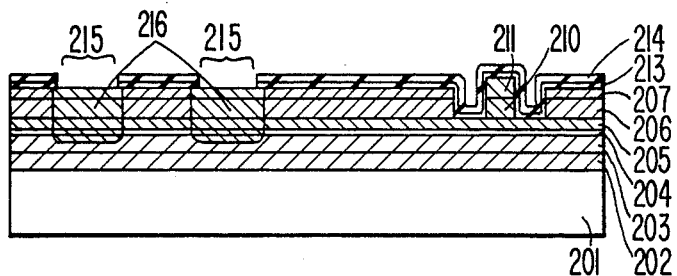

Then, piercing an opening 215 in a two-layer film composed of a 300 nm thick silicon nitride film 213 deposited, for example, by plasma-assisted CVD method and a 200 nm thick silicon dioxide film 214 deposited, for example, by thermal CVD method, and using the two-layer film as the mask, a P type impurity of Zn is diffused from the opening 215 for 10 minutes at 500° C. until reaching or passing through the base layer (waveguide layer) 205 in a fused silica ampule, using $ZnP_2$ as diffusion source, thereby forming a graft base region 216 as shown in FIG. 3E. Using the silicon nitride film 213 as the mask, the N type InGaAsP emitter contact layer 207 is etched by a mixed solution of, for example, $H_2SO_4:H_2O_2:H_2O = 1:1:5$, and furthermore by performing side etching, the InGaAsP emitter contact layer 207 in the Zn-diffused region is removed.

Figure 3F:
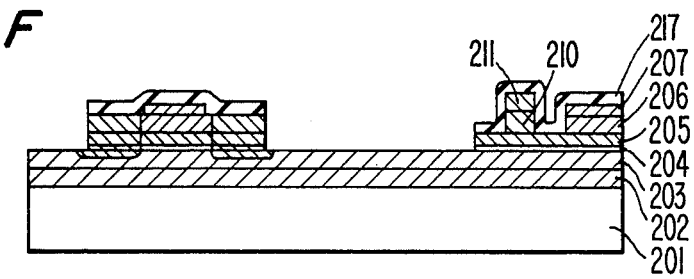

After this step, a 300 nm thick silicon nitride film 217 deposited, for example, by a plasma-assisted CVD method is formed in such a manner as to cover the emitter and base regions of the heterojunction bipolar transistor, and the stripe region of the laser, and using this silicon nitride film 217 as a mask, the N type InGaAsP emitter contact layer 207 is etched by a mixed solution of, for example, $H_2SO_4:H_2O_2:H_2O = 1:1:5$. At the time of this etching, the P type InGaAsP waveguide layer 205 is not etched and left over because the etching speed of the mixed solution of $H_2SO_4:H_2O_2:H_2O = 1:1:5$ is lower than that of the N type InGaAsP emitter contact layer 207 (about 1/5). Furthermore, the N type InP emitter 206 is etched by a mixed solution of, for example, $HCl:H_3PO_4 = 1:2$, and also the P type InGaAsP waveguide layer 205 and the InGaAsP active layer 204 are etched by a mixed solution of, for example, $H_2SO_4:H_2O_2:H_2O = 1:1:5$, so that the surface of the N type InP cladding layer (collector layer) 203 is exposed as shown in FIG. 3F.

Figure 3G:
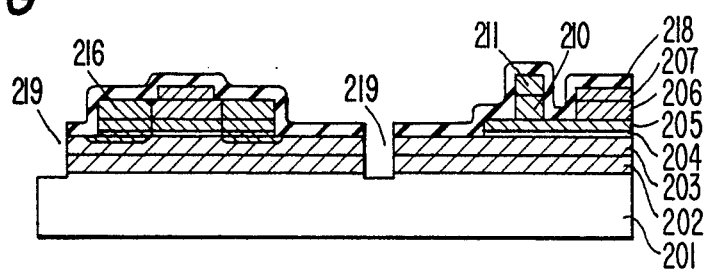
Figure 3H:
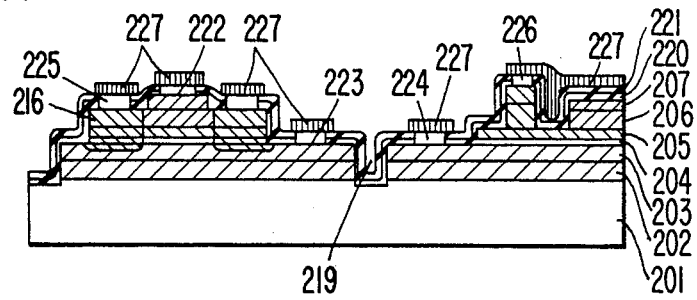
Figure 4A:
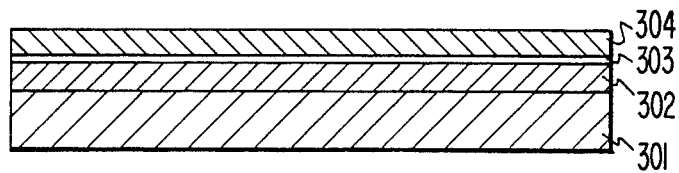
FIG. 4A to FIG. 4H are sectional views showing the fabrication steps of a conventional optoelectronic integrated circuit.
Figure 4B:
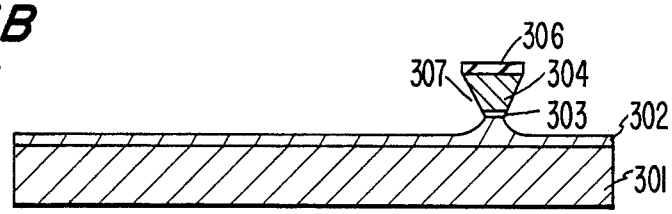
Figure 4C:
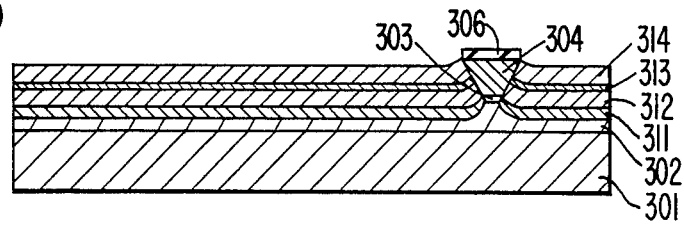
Figure 4D:
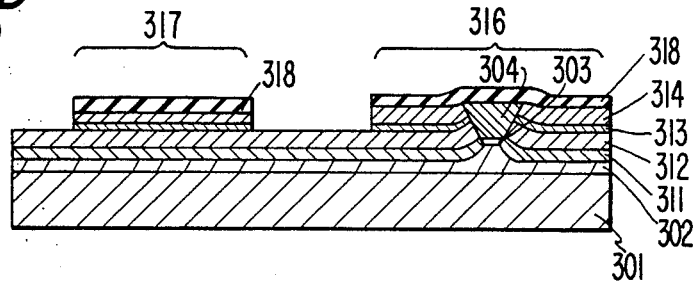
Figure 4E:
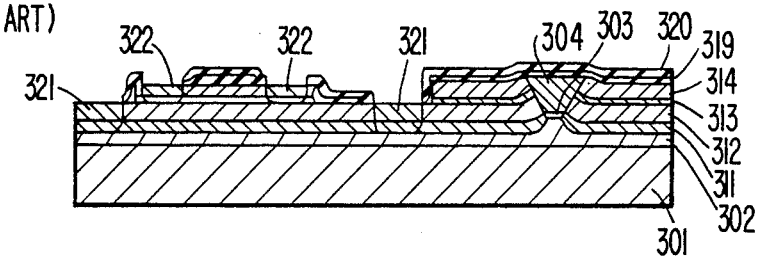
Figure 4F:
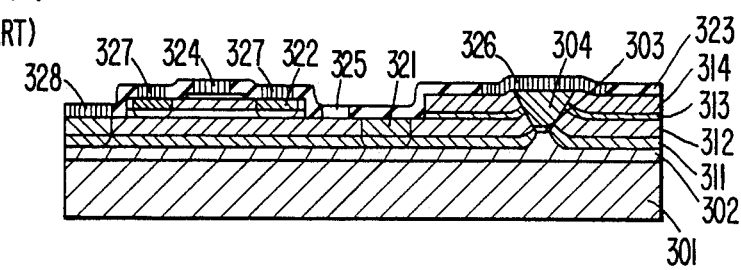
Figure 4G:
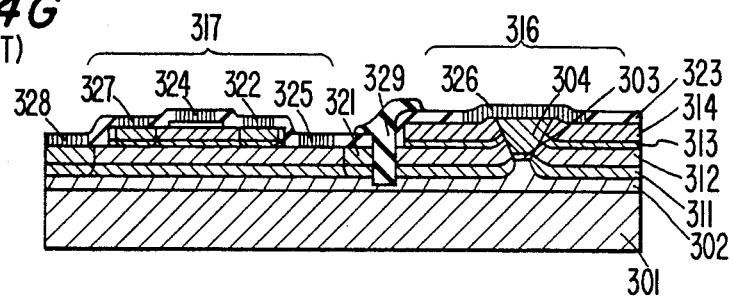
Figure 4H:
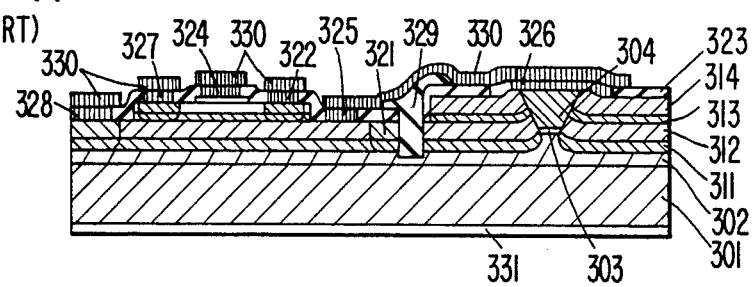

Sequentially, piercing an opening in a 300 nm thick silicon nitride film 218 newly deposited by, for example, a plasma-assisted CVD method and using this silicon nitride film 218 as a mask, the N type InP collector layer (cladding layer) 203 and N$^+$ type InP cladding layer 202 are etched by a mixed solution of, for example, $HCl:H_3PO_4 = 1:2$, thereby forming a separation groove 219 for electrically isolating and separating the devices as shown in FIG. 3G. The separation groove has a side wall perpendicular to the principal plane of the semi-insulating InP substrate 101 as shown in FIG. 3G in the direction of <011> parallel to the stripe of the laser, while it has a V-shaped tapered side surface in the direction of <01$\bar{1}$>perpendicular to the stripe of the laser.

As the passivation films, a 300 nm thick silicon nitride 220 is then deposited, for example, by a plasma-assisted CVD method, and a 200 nm thick silicon dioxide film 221 deposited, for example, by a thermal CVD method, and as a contact metal, for example, 10/15/300 nm thick Au/Sn/Au is evaporated, and an emitter electrode 222, a collector electrode 223, and a cathode electrode 224 are formed by the lift-off method. Furthermore, by evaporating, for example, 10/10/300 nm thick Au/Zn/Au electrode material, a base electrode 225 and an anode electrode 227 are formed by the lift-off method. Finally, for example, by evaporating 50/50/400 nm thick Cr/Pt/Au electrode material, an interconnection 227 between devices is formed by the lift-off method, so that an optoelectronic integrated circuit of the second embodiment of this invention is completed. In this interconnection, disconnection can be prevented by running along the V-shaped tapered side surface of the separation groove in the direction of <01$\bar{1}$>.

The unique features of the second embodiment of this invention not found in the first embodiment is that a junction having very few defects may be obtained because the base and emitter layer are continuously grown by the first liquid phase epitaxy.

As evident from the description of the first and second embodiments of this invention, the optoelectronic integrated circuit of this invention has a simple structure in which the N type cladding layer of the laser and collector layer of heterojunction bipolar transistor, and the P type waveguide layer of the laser and base layer of heterojunction bipolar transistor are common to each other, respectively, and since the base layer is formed on the flat substrate surface by the first epitaxial growth, the thickness is uniform, so that the current gain is uniform among the devices. It is another feature of this invention that the structure of device is simple because the conventionally required P type InP separation layer is not needed, and it is a still further feature that the carrier density of the N type InP collector layer (cladding layer) contacting the base is lowered and that of the N$^+$ type InP collector (cladding layer) contacting the semi-insulating substrate is increased in the two-layer structure of the collector layer. As a result, the collector capacity is reduced and the collector resistance is decreased, so that the operation speed can be raised.

Moreover, the base of the heterojunction bipolar transistor of the optoelectronic integrated circuit of this invention has a layer common to the active layer narrower in the band gap than the base at the collector side. To raise the operation speed of a heterojunction bipolar transistor, it is necessary to increase the carrier density of the base to reduce the base resistance, and to lower the carrier density of the collector to reduce the collector capacity, but when the carrier density of the base is increased, the base impurity is diffused again into the collector side at the time of second liquid phase epitaxial growth, and conventionally it was impossible to raise the carrier density of the base. In this invention, on the other hand, since there is a layer common to the active layer narrower in the band gap than the base between the base and collector, the re-diffusion of the base impurity can be arrested at the active layer. If the thickness of the base layer (waveguide layer) is $W_B$, and the diffusion length of the electron in the base layer is $L_B$, and the thickness of the P type active layer, in which the impurity of the base is diffused, is $W_A$, and the diffusion length of electron in the P type active layer is $L_A$, then the current gain of the heterojunction bipolar transistor is given as follows:

$$\beta = 1/\{\cosh(W_B/L_B) \cosh(W_A/L_A) - 1\}$$

In this equation, when $W_B > W_A$, if $W_A$ changes, the value of the current gain does not change so much, so that the change in the current gain due to re-diffusion of the impurity can be diminished.

In this invention, incidentally, since the devices can be isolated and separated only by forming a separation groove which as as shallow as about 2 μm, the longterm thermal diffusion as required conventionally is not needed, and the deterioration of the devices due to thermal diffusion is slight.

In the description of the embodiment above, needless to say, the P type and N type conductive types may be reversed. Furthermore, in the description of the above embodiments, this invention was applied to a InP/InGaAsP type optoelectronic integrated circuit, but it is also evident that this invention may be similarly applied to a GaAs/AlGaAs type optoelectronic integrated circuit.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

We claim:
1. An optoelectronic integrated circuit comprising:
a laser device including a first cladding layer of a first type of conductivity formed on a semi-insulating substrate, an active layer formed on said first cladding layer of said first type of conductivity, a waveguide layer of a second type of conductivity formed on said active layer being wider in band gap than said active layer, and a second cladding layer of said second type of conductivity formed partially on the surface of said waveguide layer of said second type of conductivity being wider in band gap than said waveguide layer; and
a heterojunction bipolar transistor including an emitter layer of said first type of conductivity formed partially on the surface of said waveguide layer of said second type of conductivity being wider in band gap than said waveguide layer, a collector formed by a portion of said first cladding layer of said first type of conductivity and a base formed by a portion of said waveguide layer of said second type of conductivity.

* * * * *